United States Patent
Liao

(10) Patent No.: US 12,507,518 B2
(45) Date of Patent: Dec. 23, 2025

(54) DIODE PACKAGE FOR SERIES CIRCUIT

(71) Applicant: CHENMKO ENTERPRISE CO., LTD., New Taipei (TW)

(72) Inventor: Huang-Shun Liao, New Taipei (TW)

(73) Assignee: CHENMKO ENTERPRISE CO., LTD., New Taipei (TW)

( * ) Notice: Subject to any disclaimer, the term of this patent is extended or adjusted under 35 U.S.C. 154(b) by 386 days.

(21) Appl. No.: 18/314,837

(22) Filed: May 10, 2023

(65) Prior Publication Data
US 2023/0369554 A1    Nov. 16, 2023

(30) Foreign Application Priority Data
May 11, 2022   (TW) .................................. 111117671

(51) Int. Cl.
*H10H 20/857* (2025.01)
*H01L 23/495* (2006.01)

(52) U.S. Cl.
CPC ................................ *H10H 20/857* (2025.01)

(58) Field of Classification Search
CPC ............ H10H 20/857; H01L 23/49575; H01L 23/49562; H01L 23/49524; H01L 23/49561
See application file for complete search history.

(56) References Cited

U.S. PATENT DOCUMENTS

| 2016/0148859 A1 | 5/2016 | Muto et al. |
| 2018/0152113 A1* | 5/2018 | Xu ..................... H01L 23/49531 |
| 2018/0178658 A1* | 6/2018 | Wu ..................... H01L 23/49524 |
| 2023/0207431 A1* | 6/2023 | Yanagida ................ H01L 25/18 |

FOREIGN PATENT DOCUMENTS

CN    209709964 U    * 11/2019

* cited by examiner

*Primary Examiner* — Antonio B Crite

(57) ABSTRACT

A diode package for series circuit includes a plurality of conductive bearing frames, a plurality of diode chips and a plurality of conductive bridging frames. Each the bearing frame has a chip setting portion or a bridging portion, or has a chip setting portion and a bridging portion bent in the chip setting portion. Each the diode chip is disposed on each chip setting portion. Each the bridging frame bridges between two adjacent bearing frames. Two ends of each the bridging frame are respectively connected to each the diode chip and each the bridging portion to form a series structure.

6 Claims, 3 Drawing Sheets

DIODE PACKAGE FOR SERIES CIRCUIT

CROSS-REFERENCE TO RELATED APPLICATION

This non-provisional application claims priority under 35 U.S.C. § 119(a) on Patent Application No(s). 111117671 filed in Taiwan, R.O.C. on May 11, 2022, the entire contents of which are hereby incorporated by reference.

BACKGROUND OF THE INVENTION

1. Field of the Invention

The present disclosure relates to a diode package, and in particular to a diode package for series circuit.

2. Description of the Related Art

In electronic circuits, diode elements are often used to perform rectification, voltage stabilizing, and loop protection. To apply to high-voltage circuits, a plurality of diode elements can be connected in series in the circuit.

BRIEF SUMMARY OF THE INVENTION

The inventors believe that the way of the prior art in which a plurality of diodes are connected in series in a circuit increases the complexity of the circuit and is not conducive to the automated process.

In view of the shortcomings of the prior art, the inventor exhausted his mind to provide a diode package for series circuit, in order to apply to a high-voltage circuit, so that the applied circuit is simplified and conducive to the automated process.

To achieve the above objective and other objectives, the disclosure provides a diode package for series circuit, comprising a plurality of conductive bearing frames, a plurality of diode chips and a plurality of conductive bridging frames. Each the bearing frame has a chip setting portion or a bridging portion, or has a chip setting portion and a bridging portion bent in the chip setting portion. Each the diode chip is disposed on each chip setting portion. Each the bridging frame bridges between two adjacent bearing frames. Two ends of each the bridging frame are respectively connected to each the diode chip and each the bridging portion to form a series structure.

In one embodiment, the bearing frames may include an inlet frame, an outlet frame and at least one intermediate frame arranged between the inlet frame and the outlet frame.

In one embodiment, the inlet frame has only the chip setting portion, the outlet frame has only the bridging portion, the at least one intermediate frame may have the chip setting portion and the bridging portion bent in the chip setting portion.

In one embodiment, the at least one intermediate frame may be an L shape and complementarily arranged to each other between the inlet frame and the outlet frame.

In one embodiment, the bearing frames complementarily arranged to each other may have at least one turning site.

In one embodiment, the diode package for series circuit may further comprise a package body, the package body covers the bearing frames, the diode chips and the bridging frames to form a package structure.

In one embodiment, each the bearing frame may be provided with a pin protruding from the package body.

In one embodiment, the bridging frames may be disposed parallel to each other.

In one embodiment, the diode chip may comprise a silicon (Si) based Schottky diode, silicon carbide (SiC) Schottky diode, gallium nitride (GaN) diode, gallium arsenide (GaAs) diode, fast recovery diode or general PN junction diode.

Accordingly, by means of the bearing frames and the bridging frames connecting the plurality of diode chips in series, the diode package for series circuit of the embodiment of the present disclosure may be applied to a high-voltage circuit, so that the applied circuit is simplified and conducive to the automated process.

DETAILED DESCRIPTION OF THE INVENTION

To facilitate understanding of the object, characteristics and effects of this present disclosure, embodiments together with the attached drawings for the detailed description of the present disclosure are provided.

Figure 1:
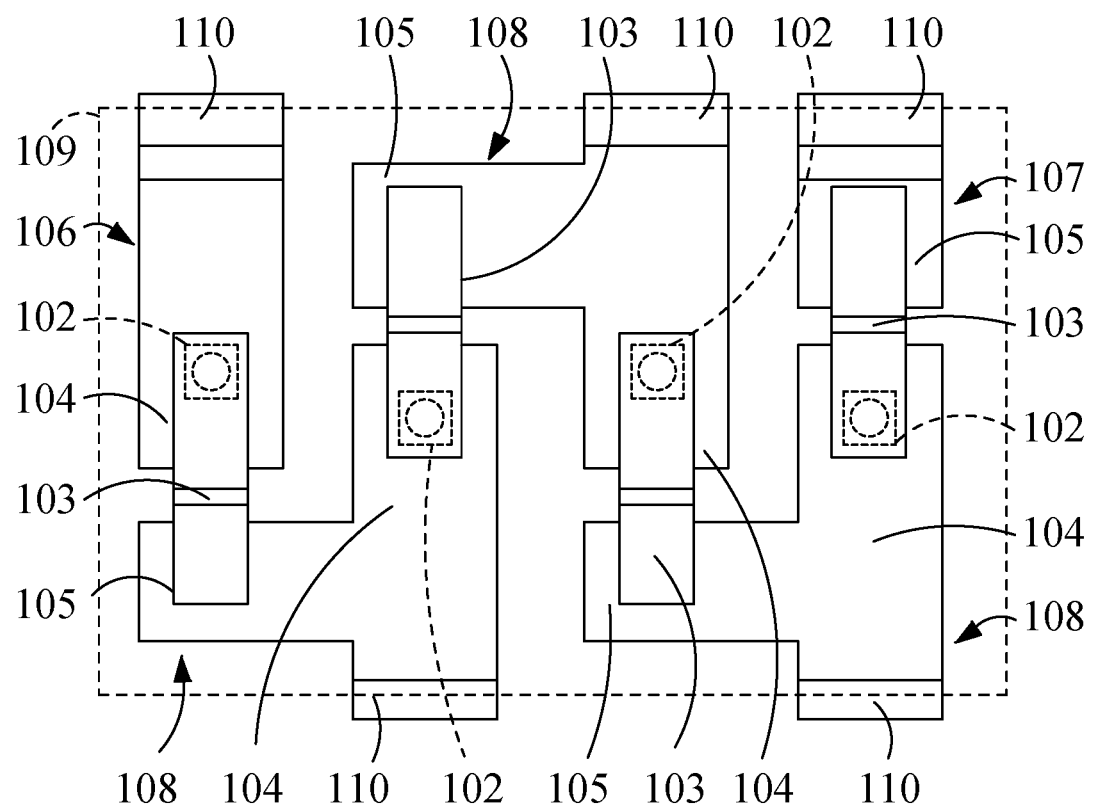
FIG. 1 is a schematic top-down perspective view of a diode package for series circuit of an embodiment of the present disclosure.
Figure 2:
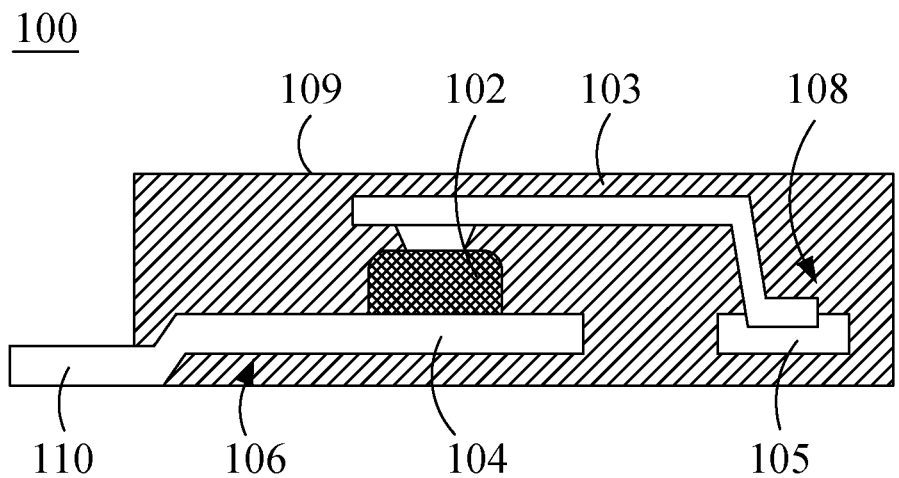
FIG. 2 is a schematic cross-sectional view of the inlet frame, the intermediate frame, the diode chip and the bridging frame carrying out bridging connection corresponding to FIG. 1.
Figure 3:
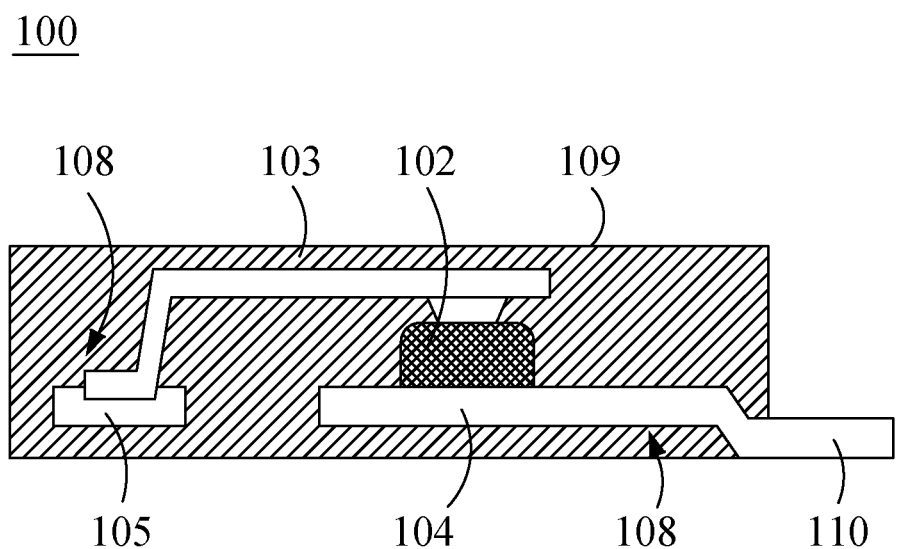
FIG. 3 is a schematic cross-sectional view of the two intermediate frames, the diode chip and the bridging frame carrying out bridging connection corresponding to FIG. 1.
Figure 4:
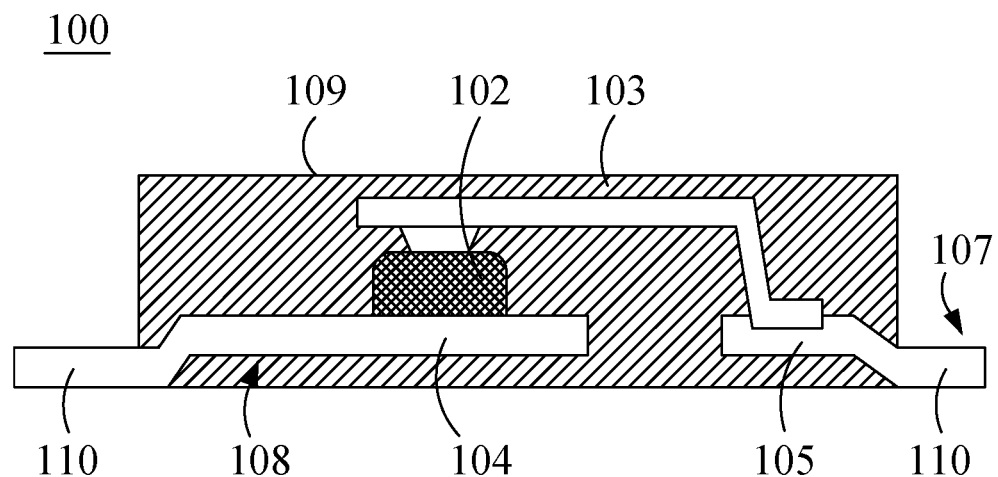
FIG. 4 is a schematic cross-sectional view of the outlet frame, the intermediate frame, the diode chip and the bridging frame carrying out bridging connection corresponding to FIG. 1.

Referring to FIGS. 1 to 4, as shown in FIG. 1, an embodiment of the present disclosure provides a diode package for series circuit 100, comprising a plurality of conductive bearing frames 101, a plurality of diode chips 102 and a plurality of conductive bridging frames 103. Each the bearing frame 101 has a chip setting portion 104 or a bridging portion 105, or has a chip setting portion 104 and a bridging portion 105 bent in the chip setting portion 104. Each the diode chip 102 is disposed on each chip setting portion 104. Each the bridging frame 103 bridges between two adjacent bearing frames 101. Two ends of each the bridging frame 103 are respectively connected to each the diode chip 102 and each the bridging portion 105 to form a series structure. The diode chip 102 comprises a silicon (Si) based Schottky diode, silicon carbide (SiC) Schottky diode, gallium nitride (GaN) diode, gallium arsenide (GaAs) diode, fast recovery diode, general PN junction diode, but not limited to thereto, may also be other kinds of diode chips.

Accordingly, by means of the bearing frames 101 and the bridging frames 103 connecting the plurality of diode chips 102 in series, the diode package for series circuit 100 of the embodiment of the present disclosure may be applied to a high-voltage circuit (not shown), so that the applied circuit is simplified and conducive to the automated process.

As shown in FIGS. 1 to 4, in one embodiment, the bearing frames 101 may include an inlet frame 106, an outlet frame 107 and at least one intermediate frame 108 arranged between the inlet frame 106 and the outlet frame 107. The inlet frame 106 has only the chip setting portion 104, the outlet frame 107 has only the bridging portion 105. The at least one intermediate frame 108 may have the chip setting portion 104 and the bridging portion 105 bent in the chip setting portion 104. In FIG. 1, the number of intermediate frames 108 is plural, and the intermediate frames 108 may respectively be an L shape and complementarily arranged to each other between the inlet frame 106 and the outlet frame 107, so that the series structure formed is aggregated, and the bridging frame 103 can bridge two bearing frames 101 without a length that is too long, FIG. 1 includes one bridging frame 103 bridging between the inlet frame 106 and one intermediate frame 108, two bridging frames 103 bridging between three intermediate frames 108 and one bridging frame 103 bridging between one intermediate frame 108 and the outlet frame 107. The number of intermediate frames 108 shown in FIG. 1 is three, but not limited to thereto. In the above configuration, the bearing frames 101 complementarily arranged to each other may have at least one turning site, and the bridging frames 103 may be disposed parallel to each other. The two ends of each the bridging frame 103 may be respectively soldered to one diode chip 102 and one bridging portion 105, but not limited to thereto. The material of the bearing frames 101 and the bridging frames 103 may be copper or iron-nickel alloy.

Figure 5:
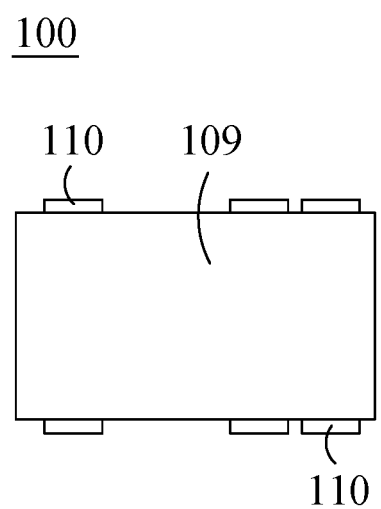
FIG. 5 is a schematic top view corresponding to FIG. 1.
Figure 6:
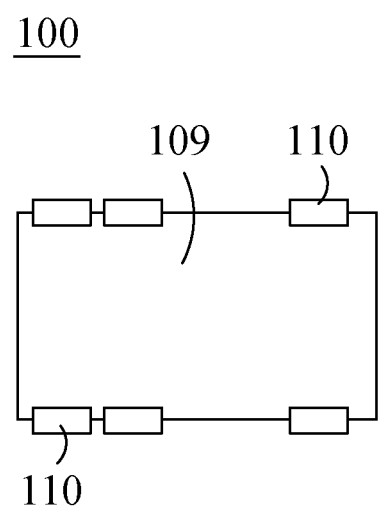
FIG. 6 is a schematic bottom view corresponding to FIG. 1.

As shown in FIGS. 1 to 6, in one embodiment, the diode package for series circuit 100 may further comprise a package body 109. The package body 109 covers the bearing frames 101, the diode chips 102 and the bridging frames 103 to form a package structure. Each the bearing frame 101 may be provided with a pin 110 protruding from the package body 109, so that when the diode package for series circuit 100 is mounted on a circuit board (not shown), it is electrically connected to the circuit on the circuit board (not shown). As shown in FIGS. 5 and 6, two sides of the diode package for series circuit 100 have a plurality of pins 110 protruding from the package body 109. The package body 109 may be epoxy resin or other insulating package material.

While the present invention has been described by means of specific embodiments, those skilled in the art should understand the above description is merely embodiments of the invention, and it should not be considered to limit the scope of the invention. It should be noted that all changes and substitutions which come within the meaning and range of equivalency of the embodiments are intended to be embraced in the scope of the invention. Therefore, the scope of the invention is defined by the claims.

What is claimed is:

1. A diode package for series circuit, comprising:
a plurality of bearing frames, each the bearing frame has a chip setting portion or a bridging portion, or has a chip setting portion and a bridging portion bent in the chip setting portion, the bearing frames include an inlet frame, an outlet frame and at least one intermediate frame arranged between the inlet frame and the outlet frame, the inlet frame has only the chip setting portion, the outlet frame has only the bridging portion, the at least one intermediate frame has the chip setting portion and the bridging portion bent in the chip setting portion;
a plurality of diode chips, each the diode chip is disposed on each chip setting portion; and
a plurality of bridging frames, each the bridging frame bridges between two adjacent bearing frames, two ends of each the bridging frame are respectively connected to each the diode chip and each the bridging portion to form a series structure,
wherein the at least one intermediate frame is an L shape and complementarily arranged to each other between the inlet frame and the outlet frame.

2. The diode package for series circuit according to claim 1, wherein the bridging frames are disposed parallel to each other.

3. The diode package for series circuit according to claim 1, wherein the diode chip comprises a silicon (Si) based Schottky diode, silicon carbide (SiC) Schottky diode, gallium nitride (GaN) diode, gallium arsenide (GaAs) diode, fast recovery diode or general PN junction diode.

4. The diode package for series circuit according to claim 1, further comprising a package body, the package body covers the bearing frames, the diode chips and the bridging frames to form a package structure.

5. The diode package for series circuit according to claim 4, wherein each the bearing frame is provided with a pin protruding from the package body.

6. A diode package for series circuit, comprising:
a plurality of bearing frames, each the bearing frame has a chip setting portion or a bridging portion, or has a chip setting portion and a bridging portion bent in the chip setting portion, the bearing frames include an inlet frame, an outlet frame and at least one intermediate frame arranged between the inlet frame and the outlet frame, the inlet frame has only the chip setting portion, the outlet frame has only the bridging portion, the at least one intermediate frame has the chip setting portion and the bridging portion bent in the chip setting portion;
a plurality of diode chips, each the diode chip is disposed on each chip setting portion; and
a plurality of bridging frames, each the bridging frame bridges between two adjacent bearing frames, two ends of each the bridging frame are respectively connected to each the diode chip and each the bridging portion to form a series structure,
wherein the at least one intermediate frame is an L shape and complementarily arranged to each other between the inlet frame and the outlet frame, and
wherein the bearing frames complementarily arranged to each other have at least one turning site.

* * * * *